United States Patent [19]
Vinson et al.

[11] Patent Number: 5,884,834
[45] Date of Patent: Mar. 23, 1999

[54] MULTI-FREQUENCY ULTRASONIC WIRE BONDER AND METHOD

[75] Inventors: Michael Riley Vinson, Hume Park, Singapore; Wei Ivy Qin, Montgomery; Lee Robert Levine, New Tripoli, both of Pa.

[73] Assignee: Kulicke and Soffa Investments, Inc., Wilmington, Del.

[21] Appl. No.: 717,503

[22] Filed: Sep. 20, 1996

[51] Int. Cl.⁶ .................................................. H01L 21/607
[52] U.S. Cl. ......................................... 228/102; 228/110.1
[58] Field of Search ................................. 228/102, 110.1, 228/180.5, 1.1, 4.5; 156/73.7; 217/56.21

[56] References Cited

U.S. PATENT DOCUMENTS

| | | | |
|---|---|---|---|
| 4,586,642 | 5/1986 | Dreibelbis et al. | 228/4.5 |
| 5,578,888 | 11/1996 | Safabakhsh | 310/328 |

*Primary Examiner*—Samuel M. Heinrich
*Attorney, Agent, or Firm*—John B. Sowell-Aty.

[57] ABSTRACT

The present invention includes a multi-frequency ultrasonic generator coupled to a multi-resonance frequency transducer capable of operating at a plurality of usable resonance frequencies. A controller is coupled to a power amplifier that drives the ultrasonic transducer and is capable of applying power, voltage or current profiles for each of the resonance frequencies to be used during a bonding operation independent of the others.

15 Claims, 6 Drawing Sheets

| | SINGLE FREQ SHEAR IN GR | DUAL FREQ SHEAR IN GR | SINGLE FREQ SQUASH IN MILS | DUAL FREQ SQUASH IN MILS |
|---|---|---|---|---|
| AVG. | 42.73 | 58.52 | 4.01 | 4.14 |
| STD DEV | 3.80 | 3.72 | 0.06 | 0.06 |
| MAX | 50.50 | 64.30 | 4.09 | 4.29 |
| MIN | 35.60 | 43.80 | 3.89 | 4.06 |
| SHEAR P.U.A. (GRAM/MIL²) | 3.39 | 4.34 | N.A. | N.A. |

| STAGE | 60 KHz | 120 KHz |
|---|---|---|
| 0 | DEFORMATION RESULTING IN STRAIN HARDENING | HIGH STRAIN RATE HARDENING WITH SLIGHT DEFORMATION |
| 1 | SLIP | |
| 2 | COUPLE FORMATION WITH ULTRASONIC ENHANCED DIFFUSION | |
| 3 | BOND AREA INCREASE | |

*Figure 6*

| | SINGLE FREQ SHEAR IN GR | DUAL FREQ SHEAR IN GR | SINGLE FREQ SQUASH IN MILS | DUAL FREQ SQUASH IN MILS |
|---|---|---|---|---|
| AVG. | 42.73 | 58.52 | 4.01 | 4.14 |
| STD DEV | 3.80 | 3.72 | 0.06 | 0.06 |
| MAX | 50.50 | 64.30 | 4.09 | 4.29 |
| MIN | 35.60 | 43.80 | 3.89 | 4.06 |
| SHEAR P.U.A. (GRAM/MIL$^2$) | 3.39 | 4.34 | N.A. | N.A. |

*Figure 7*

MULTI-FREQUENCY ULTRASONIC WIRE BONDER AND METHOD

BACKGROUND OF THE INVENTION

1. Field of the Invention

The present invention relates to fine wire bonding employing ultrasonic energy applied to the fine wire by a bonding tool held and controlled by an automatic wire bonder. More particularly, the present invention relates to a system and a process of multi-frequency wire bonding wherein a plurality of different resonant frequencies are applied to the same transducer during a single wire bond operation.

2. Description of the Prior Art

Heretofore, ultrasonic transducers used for fine wire bonding were designed and manufactured for use at a single high efficiency resonance frequency. It was generally known that such transducers had one efficient resonant frequency, however, it was not known or appreciated that such transducers could be made which had two distinct resonance frequencies until disclosed in copending U.S. Ser. No. 08/349,251 filed Dec. 5, 1994 for a Multi Resonance Unibody Ultrasonic Transducer by Ali R. Safabakhah and assigned to the same assignee as the present invention.

Heretofore, it was generally known that fine wire bonds made at 60 Khz form in a different manner and display different shear strength characteristics from fine wire bonds made at 120 Khz. There is little or no available data defining the intermetallic structure and shear bond strength for wire bonds made at frequencies that dramatically differ from these frequencies and their closely associated frequencies. Lee Levine summarized the state of art theories concerning wire bonds made at these frequencies in his article "The Ultrasonic Wedge Bonding Mechanism: Two Theories Converge" presented at the International Symposium on Microelectronics (ISHM) Proceedings dated Oct. 24–26, 1995 at pages 242 to 246.

Summarized, this article disclosed that wire bonds made at high frequencies (e.g. 120 Khz) cause the material at the interface of the wire bond to have high rates of strain hardening accompanied by slight deformation in the initial stages of forming a bond. All things being equal wire bonds made at low frequencies (e.g. 60 Khz) have lesser rates of strain hardening accompanied by greater squash and bond area resulting in stronger shear strength wire bonds.

It would be desirable to provide a system and a method for making fine wire bonds employing two or more resonance frequencies so as to take advantage of all the desirable characteristics which can be achieved using either high or low resonance frequencies. Multi-resonance frequency bonding transducers having two or more efficient resonance frequencies will now permit the incorporation of multi-resonance frequency methods and systems into a new automatic wire bonders as well as permitting retrofitting such systems into existing automatic wire bonders.

SUMMARY OF THE INVENTION

It is a principal object of the present invention to provide a new system and method for making multi-frequency wire bonds.

It is a principal object of the present invention to provide a method of making multi-frequency wire bonds faster than single frequency wire bonds and to produce wire bonds that are stronger than single frequency wire bonds.

It is a principal object of the present invention to provide a method for setting desirable values of power and frequency for first bonds and different values of power and frequencies when subsequently bonding at second bond.

It is a principal object of the present invention to provide a method of rapidly determining an optimum power profile for two or more resonance frequencies when performing multi-frequency bonding operations.

It is a principal object of the present invention to select a power profile for a composite bonding frequency or frequencies.

It is a principal object of the present invention to provide a method and apparatus for making multi-frequency wire bonds using voltage, current and/or power profiles.

It is a general object of the present invention to provide a method and a system for improving the consistency of the strength of wire bonds made on bonding targets which may have varied surface conditions.

According to these and other objects of the present invention, there is provided a multi-frequency ultrasonic generator coupled to a multi-resonance frequency transducer capable of supplying usable power at two or more resonance frequencies. A power level profile vs. time is generated for each of the resonance frequencies to be used during a bonding operation. The power level of the high resonance frequency is reduced as soon as diffusion bonding begins and the power level of the low resonance frequency is then increased to enhance diffusion migration and bond area growth. In the preferred embodiment of the present invention, the multi-resonance frequencies are started after application of a bonding force and are terminated before all bonding force is removed. The bonding operation may also be conducted using constant power, voltage or current during any phase of the bonding operation.

DESCRIPTION OF A PREFERRED EMBODIMENT

Before describing the system and method employed in the present invention, the following terms and formula will be employed to best describe the novel process. Assuming the power being applied to the multi-resonance frequency transducer is represented by alternating sinusoidal voltage and current waveforms (V and I), and that the high and low frequencies ($F_{HI}$) and ($F_{LO}$) are resonance frequencies under load conditions, it follows that:

$$P = I \times V \cos\theta \tag{1}$$

and the composite or total power ($P_c$) is:

$$P_c = P_{LO} \sin(2\pi F_{LO} \cdot t) + P_{HI} \sin(2\pi F_{HI} \cdot t) \tag{2}$$

The displacement (D) of the tip of the transducer which holds the bonding tool is a function of the composite power applied, and:

$$D \alpha\, P_c \tag{3}$$

Since dD/dt is velocity, then:

$$V_c\, \alpha\, dP_c/dt \tag{4}$$

The composite displacement ($D_c$) may also be defined as a constant $C_1$ multiplied times Power, and:

$$D_c = C_1 \cdot P_c = C_1 [P_{LO} \sin(2\pi F_{LO} \cdot t) + P_{HI} \sin(2\pi F_{HI} \cdot t)] \tag{5}$$

$$D_{max} = C_1 (P_{LO} + P_{HI}) \tag{6}$$

The velocity (V) of the transducer tip was described as dD/dt so that: $V_c = dD_c/dt$ and $$V_{max} = D_{max}/dt = C_1(P_{LO} + P_{HI})/dt \tag{7}$$

$$V_{max} = C_1[P_{LO}(2\pi \cdot F_{LO}) + P_{HI}(2\pi \cdot F_{HI})] \tag{8}$$

Frequency may be expressed as RMS velocity (Vrms) divided by $\sqrt{2\pi} \cdot D$, thus, the composite frequency ($F_c$) is:

$$F_c = \frac{(V\text{rms})}{\sqrt{2\pi} \cdot D} \tag{9}$$

where Vrms is a known value derived from frequency and amplitude of the high and low frequency, When the resonance frequencies under load are known and the composite power $P_c$ is programmed in response to a menu request, the host computer can and does calculate the power levels for high and low power ($P_{HI}$ and $P_{LO}$). The high and low resonance frequencies are:

$$P_{HI} = C_2 \cdot P_c + \sqrt{C_3 \cdot F_c^2 - C_4 \cdot P_c^2} \tag{10}$$

$$P_{LO} = C_5 \cdot P_c - \sqrt{C_6 \cdot F_c^2 - C_7 \cdot P_c^2} \tag{11}$$

The constants $C_2$ to $C_7$ are unique to each frequency and may be determined by the process of numerical integration, thus, it is possible to program the aforementioned constants and formula into the host computer and follow a menu driven display screen supplied on automatic wire bonders as is well known in the semiconductor industry and explained in the operation manuals that accompany every machine sold. Typical of such machines are the Models 1484-88 Automatic Gold Ball Bonders produced by Kulicke and Soffa Industries Inc. in Willow Grove, Pa. 19090.

Figure 1:
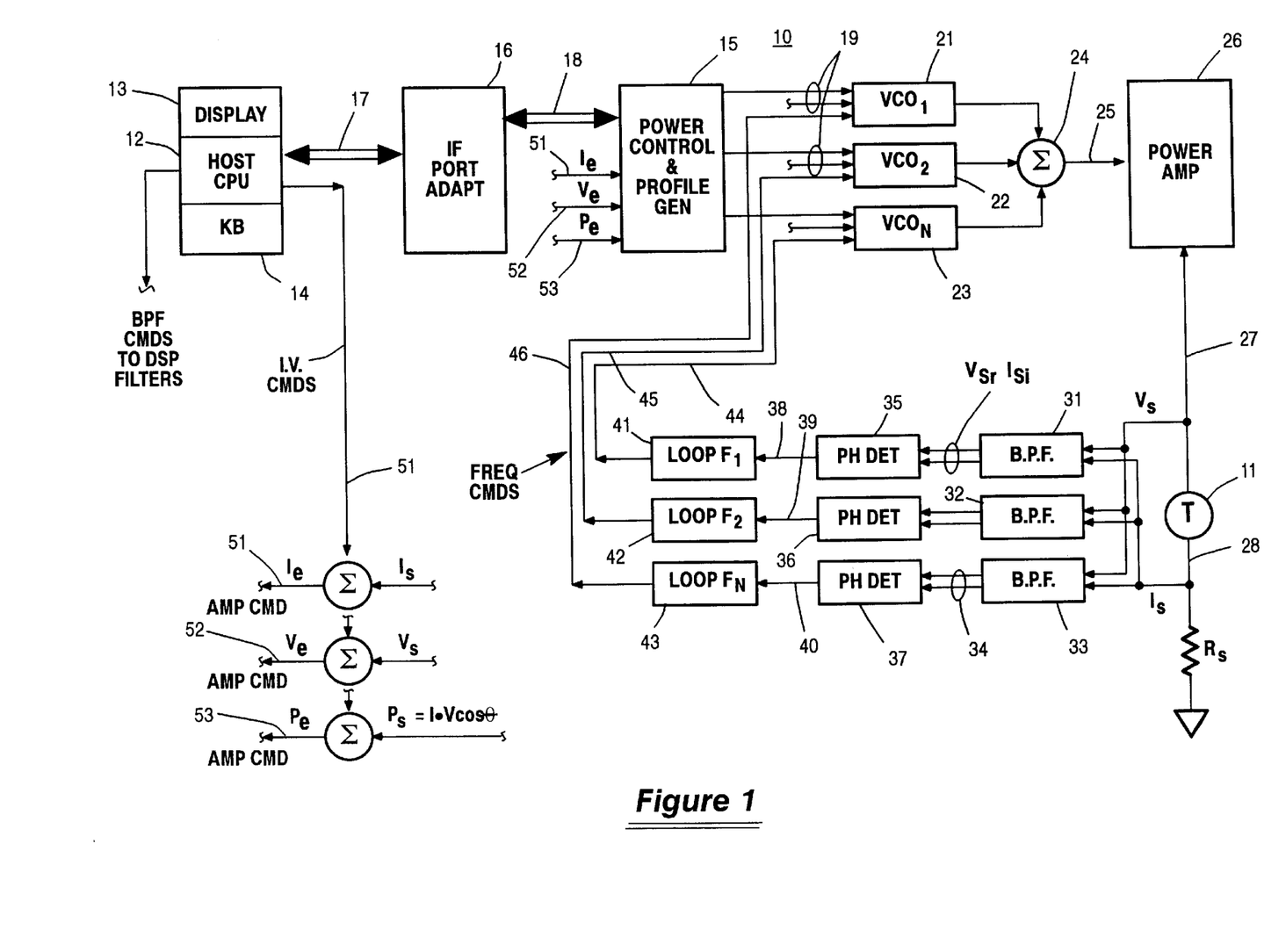
FIG. 1 is a schematic block diagram of a novel multi-frequency generator board showing an operable system for programming and operating a multi-resonance frequency transducer.

Refer now to FIG. 1 showing a schematic block diagram 10 showing a multi-frequency generator and operable system for programming and operating a multi-resonance frequency transducer 11.

A host computer 12 is provided with a display 13 which exhibits a plurality of menus that are designed to prompt an operator into setting values in a predetermined range or permitting a default setting wherein predetermined known values are assumed usually for the purpose of tuning the bonding cycle during set up or teach operations. Once the desired bonding values are established, the automatic wire bonder is capable of locating a first and a second bonding target and consistently repeating established bond values under control of CPU 12 and keyboard 14. CPU 12 is coupled to a power controller and profile generator 15 via standard interface adapters 16 and busses 17 and 18.

Preferably the profiles to be employed for high speed production are generated by the host computer 12 and stored in controller 15 which is shown coupled to three analog voltage controlled oscillators 21 to 23. In a preferred embodiment, VCOs 21 and 22 comprise a low frequency generator and a high frequency generator respectively. VCO 23 may be either a high or a low frequency generator. VCOs 21–23 are adapted to receive amplitude commands on their inputs lines 19 that are control signals adapted to maintain a predetermined control value during all or any part of a bonding cycle.

The voltage outputs from VCOs 21 to 23 have predetermined voltage amplitudes set in response to levels of a power or voltage profile in the control 15. As will be explained hereinafter, the transducer 11 has a characteristic impedance which is substantially fixed under load and is operable in response to an alternating current and voltage defined as V cos θ. The voltage outputs are summed in summary circuit 24 to produce a composite voltage on line 25 which forms a modulated composite signal as an input to power amplifier 26. The current in line 27 is passed through transducer 11 and sensing resistor $R_s$ to ground on line 28. The voltage across $R_s$ is sensed as a current $I_s$ through the transducer 11 and the input on line 27 is sensed as a voltage $V_s$. The voltages on lines 27 and 28 may be single frequency or a multi-frequency composite which are separated in band pass filters 31 to 33. The output from filters 31 to 33 comprise two separate wave forms which are in phase when the VCOs 21–23 are locked onto a resonance frequency under load. The sensed waveforms on lines 34 are applied to separate phase detectors on lines 38–40. The error signals on lines 38–40 are filtered in loop filters 41–43 to produce direct voltage control signals on lines 44–46 which complete phase lock loops (PLLs) for control of VCOs 21–23 respectively.

It is known that the frequency of a PLL can be controlled with other analog circuits or may be controlled digitally. Such digital circuits employ direct digital synthesizers which can be programmed to produce a predetermined frequency using a computer and/or a digital signal processor (not shown).

In the preferred embodiment shown, the host computer 12, and/or controller 15, can issue voltage V, and current I commands (CMDS) as a voltage level which are applied to three separate summing circuits 47–49 via bus 51. The aforementioned Is and Vs signals on lines 34 are applied to the negative inputs of summing circuits 47–49 to produce error signals on lines 51–53 that are connected back to profile generator 15 in a manner which permits feed back control of constant power, voltage or current. Each frequency to be controlled requires production of error signals on its respective lines 51–53.

Having, explained an analog multi-frequency generator of the type which is provided in an automatic wire bonder it will be appreciated that numerous new control parameters may be added to a display menu or menus of state of the art wire bonders.

As an example, a "Bond Parameter" display screen of prior art wire bonders include menu settings for bond time, bond power, bond force and ultrasonic power profiles. The present invention now permits an operator to set time and power for each of four phases of a first or a second bond operation. Since the four phases to be described hereinafter are designed to accomplish optimum results, it is also possible to enhance the desired result by employing different bonding forces during each of the phases.

In the preferred mode of operation, the composite frequency $F_c$ is chosen along with bonding forces and bonding times for different phases of a single bond. In this preferred mode of operation, the host computer calculates equations (10) and (11) and sets the power profile. A different $F_c$ can be inputted for a phase or a time and the host computer calculates a $P_{HI}$ and $P_{LO}$ as well as calculates an optimum transition rate of change.

In another preferred mode of operation, it is possible to set power levels for low and high frequency at the start and end of a bond and set the time phases of a bond operation and the host computer will calculate the rate of transition and termination of the bond profile.

In another mode of operation it is possible to bond at constant current, voltage or power as was done in the prior art and to improve the prior art bond time and bond strength by selecting sequential or simultaneous different frequencies for different phases of a bond operation.

In another mode of operation, it is possible to start with only one active frequency then terminate the bond with another different active frequency and make a desirable combination of frequencies during the transition phases. This mode permits known desirable bonding profiles to be superimposed on the selection of frequencies and bond time as well as bond forces.

Figure 2:
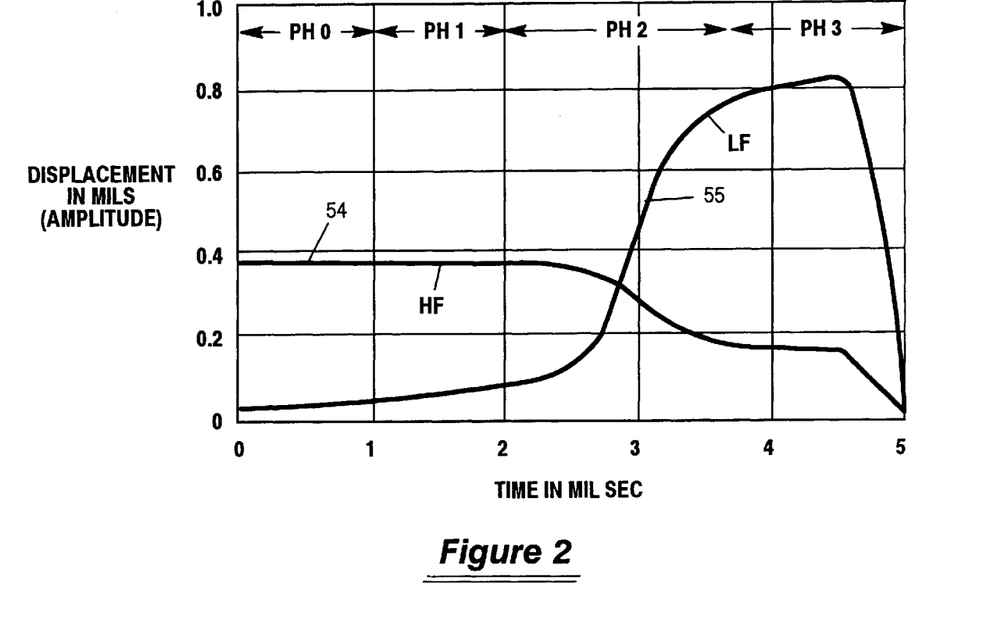
FIG. 2 is a waveform diagram of preferred embodiment energy profiles for a high frequency and a low frequency multi-resonance frequency bonding cycle.

Refer now to FIG. 2 showing a waveform diagram of a preferred smoothed energy profile of the type generated by host computer 12 and stored in profile generator 15. Alternatively, the profile could be generated and stored at controller/profile generator 15. The displacement D or amplitude of the tip of the transducer is proportional to the composite power $P_c$ as set forth previously in equation (3). The power setting on automatic wire bonders are in milliwatts and are designed to produce the maximum usable amplitudes or displacements. The displacements are in thousandths of an inch (Mils) versus time in milliseconds. The waveforms shown in FIG. 2 are for a ball bond or first bond. Comparable times and amplitudes are approximately the same for second bond.

High frequency waveform 54 starts with high power, high amplitude scrub during phase 0 and phase 1 and initiates the start of a diffusion between the intermetallic surfaces. In phase 2 the wire being bonded is locked to the substrate or bonding target and ultrasonic energy enhances the diffusion process. In phase 2 the high frequency power is lowered while the power of the low frequency waveform is increased. During phase 3 the high frequency power is reduced and terminated in the last portion of phase 3.

Low frequency waveform 55 starts with low power and low amplitude in phase 0. Waveform 55 starts its transition to high power and high amplitude in phase 2. During phase 3 maximum power is continued until the area of the desire bond is completed. In the last portion of phase 3 the low frequency power is terminated.

The power profiles shown in FIG. 2 are smoothed and represent a preferred embodiment and may be modified still further and accomplish the steps defined above that begin with scrub and slip before diffusion and locking of the wire on the substrate and end with growth of the bond area to a full size bond before termination of all power to the bond.

Figure 3:
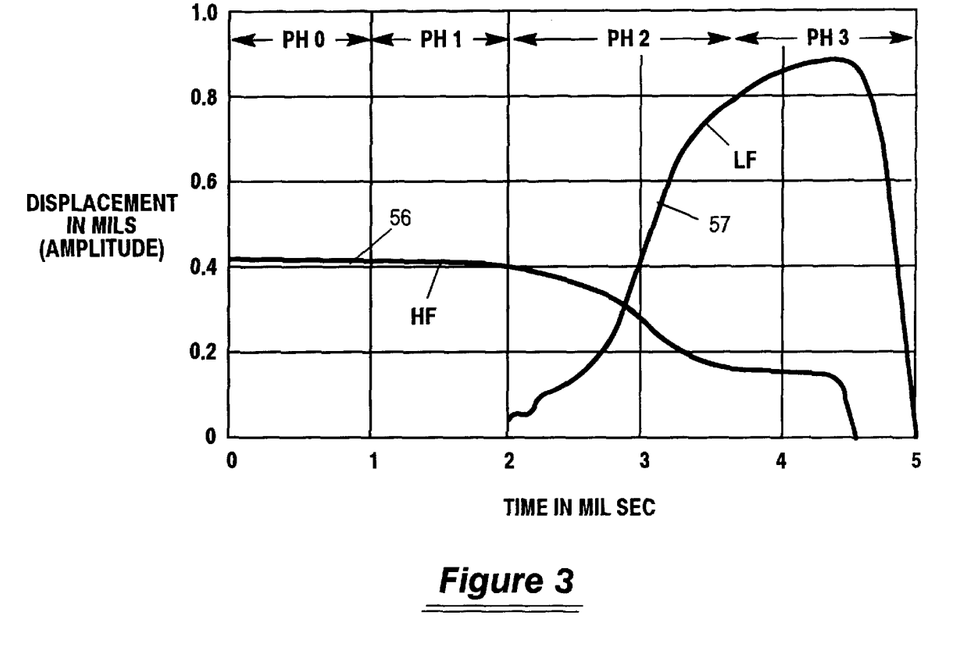
FIG. 3 is a waveforms diagram showing how FIG. 2 may be modified by delay starting the low frequency generator to overlap with termination of the high frequency during a bonding operation.

Refer now to FIG. 3 showing a modification of FIG. 2 in which high frequency waveform 56 starts with all power and low frequency waveform 57 starts with no power. After the bond begins the power on low frequency waveform starts and rises to full power while the high frequency waveform 56 is lowered. Waveform 56 is terminated before waveform 57 which terminates as before at the end of the bonding time.

Figure 4:
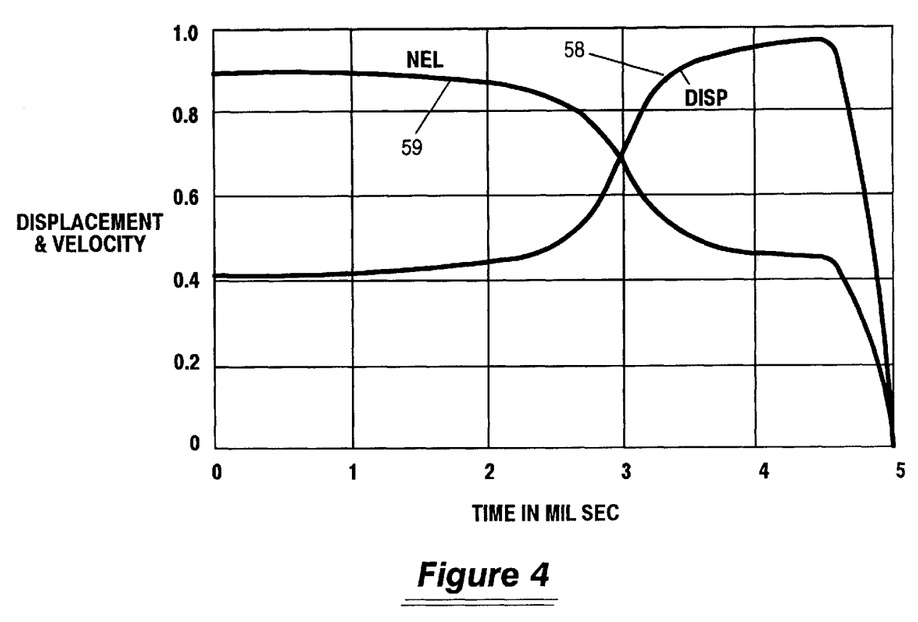
FIG. 4 is a waveform diagram of velocity and displacement of the tip of an ultrasonic transducer during the multi-frequency bonding cycle shown in FIGS. 2 and 3.

Refer now to FIG. 4 showing a waveform diagram of composite amplitude or displacement 58 versus time in milliseconds. In effect, this diagram shows a total or composite displacement 58 for the two waveforms shown in FIGS. 2 and 3. Also shown on FIG. 4 is a composite velocity waveform 59 where $V_c = dD_c/dt$.

Figure 5:
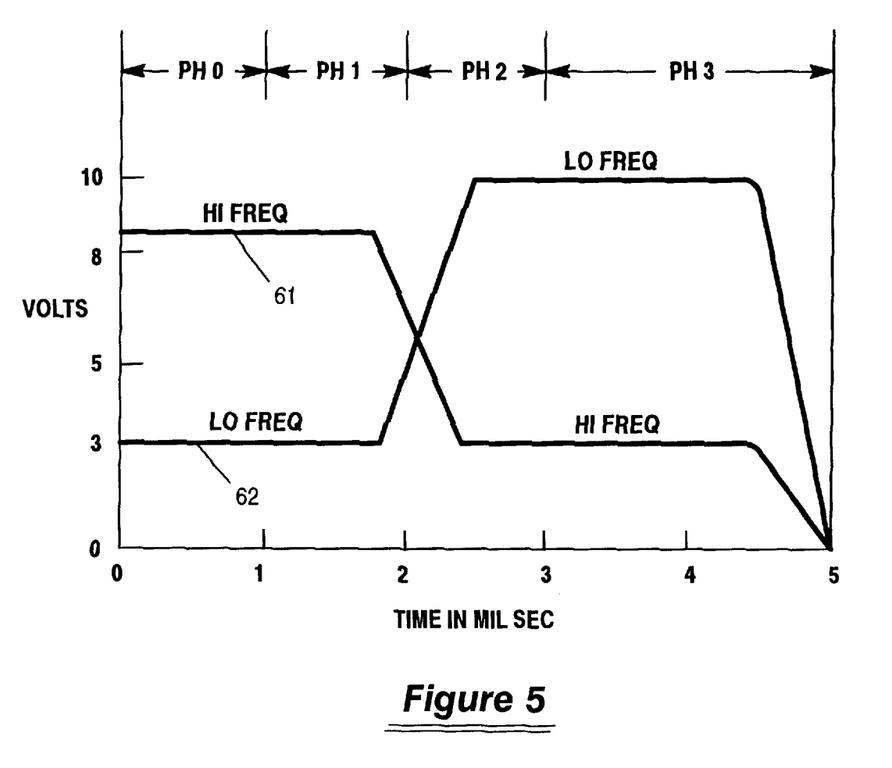
FIG. 5 is a waveform diagram showing a theoretical power level versus time for a multi-frequency bonding operation.

Refer now to FIG. 5 showing a theoretical power versus time waveform diagram which may be used to explain the theory behind the preferred embodiment. Most semiconductors to be wire bonded have pads that differ in metallurgy and cleanliness. As a result, the optimum frequency, power, bond force and time is NOT known with certainty until set up or teach test are conducted. The present invention allows the operator to vary the amount of low frequency power relative to the high frequency power to determine a composite power $P_c$ which comprises components of both low and high frequency power. This knowledge permits the operator to compute a composite frequency $F_c$ (equation 9) which lies between the high and low frequencies. The knowledge of an optimum composite frequency for a particular type of semiconductor device is translatable to similar types of devices. Accordingly, it is possible to start set up procedure and optimum setting of relative power by first selecting a composite or optimum power $P_c$. The host computer 12 can calculate optimum setting of power $P_{LO}$ and $P_{HI}$ for the waveform 61 and 62 shown in FIG. 5. The settings used for the time of phase 0 through 3 and the bonding force to be applied are more easily determinable that the optimum power for high and low frequency. This explanation and FIG. 5 clearly demonstrate that velocity $V_c = d/Dc/dt$ (equation 7) as well as the composite frequency $F_c = V/\sqrt{2\pi} \cdot D$ changes substantially after phase 1. The actual velocity of the tip of the transducer is calculable, but once the wire being bonded to the target locks to the target, the tip of the bonding tool on top of the wire is known to move, but not at the same velocity as is the transducer.

The present invention method recognizes that conventional velocity, power and frequency approaches to setting for optimum bonds has not been solved using conventional approaches. Using a preferred embodiment approach, it is now possible to find a composite frequency that will complete phases 0 and 1 in a minimum of time. Likewise it is possible to determine a composite frequency and power for completing phase 3 in a minimum of time.

The present invention shows that a nominal bonding time for a first bond is five (5) milliseconds using multi-frequency bonding. The latest state of the art commercially available automatic wire bonders used to conduct these test have a nominal bonding time of fifteen milliseconds when bonding with 60 Khz wire bonding transducers. The shortest previous programmable bonding time in the bonder used is ten milliseconds. When bonding with a 120 Khz transducer under similar conditions, the nominal bonding time was 10 milliseconds and the minimum bonding time was six milliseconds.

Figure 6:
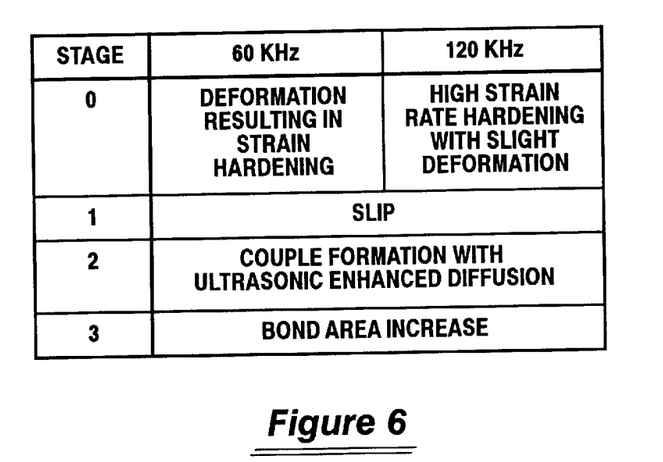
FIG. 6 is a table depicting four stages of the bond development when a fine wire is bonded to a pad on a semiconductor employing either a high or a low frequency resonance frequency transducer.

Refer now to FIG. 6 showing a table depicting four stages of the development of an ultrasonic bond on a target or bonding pad. FIG. 6 is copied from the October 1995 ISHM Proceedings paper referenced earlier and is included to show that the rate of strain hardening is higher at high frequencies than at low frequencies even before slip is terminated at the end of stage 1. In stage 2 shown there is no time comparison between frequencies for the start or the completion of stages P and V. Thus, this article and table does not teach or suggest when diffusion starts or when growth of the bond area begins as illustrated in the phases of FIGS. 2 and 3 of the present invention.

Figure 7:
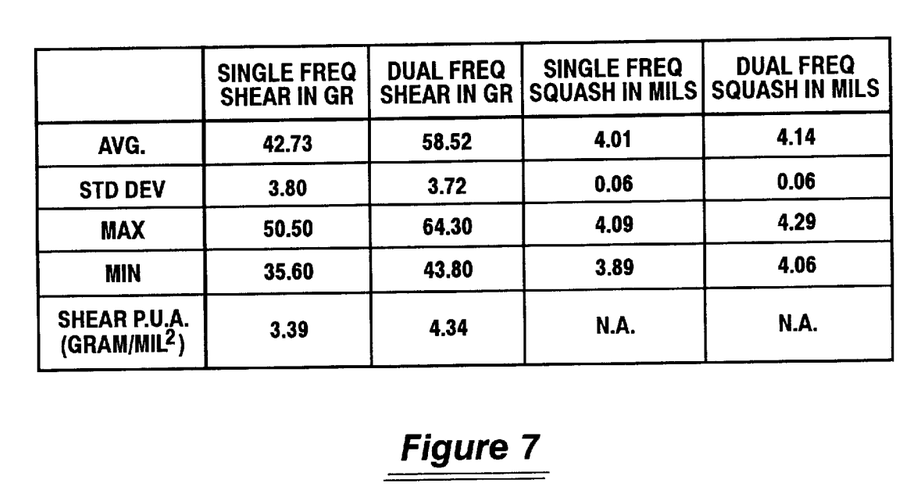
FIG. 7 is a table showing the enhanced bond shear strength achieved when employing the present invention compared to the shear strength of conventional single resonance frequency bonds.

Refer now to FIG. 7 showing a table depicting actual bond shear strength achieved employing the present invention compared to bond shear strength previously achieved using the same wire in the same transducer in the same automatic wire bonder. The headings are self explanatory and clearly show the average shear strength of dual frequency first wire bonds are stronger than equivalent prior art wire bonds by a factor of approximately forty percent. It is also shown that the bond itself is stronger per unit area (p.u.a.) by a factor of twenty-eight percent. The trend in semiconductors is pushing device densities higher and pad sizes and pad pitch smaller. Using the present invention, smaller bond size can be made without the loss of bond strength.

Having explained a preferred embodiment of the present invention, it will be appreciated that the present invention may be modified in numerous ways without departing from the scope of the invention expressed in the appended claims. Usually the low frequency power is at its lowest level at the start of a bond. It may be minimized or even omitted at the start of a bond. The converse would be true for the start of a bond being made with its lowest power component being high frequency power.

In a similar manner, one of the frequency components may be minimized at the end of a wire bond without departing from the advantages achieved in multi-frequency bonding. The principal reasons for using multi-frequency bonding is three fold: wire bonds of higher shear strength are produced with a higher degree of consistency in less time. Ultrasonic wire bonding has been used for at least thirty years and the inventors and their assignee are not aware of any previous hardware developed for a multi-frequency wire bonding process which employs two or more resonance frequencies applied simultaneously or sequentially to a responsive multi-resonance transducer.

The present invention may be used in its theoretical basic form by employing two or more ultrasonic generators and switching power to the input of the power amplifier or transducer, with or without a change of power levels which is believed to contribute to enhanced bond strength.

What is claimed is:

1. A method of making multi-frequency wire bonds with an automatic wire bonder, comprising the steps of:
    coupling a multi-resonance frequency wire bonding transducer to a source of multi-resonance frequency power,
    programming a predetermined energy control profile vs. time for each of the resonance frequencies to be used during a bonding operation, and
    bonding a fine wire to a bonding target while applying a bonding force and simultaneously controlling the energy applied to said transducer according to said profiles at said resonance frequencies during a wire bonding operation.

2. The method as set forth in claim 1 wherein the step of programming a predetermined energy control profile comprises the steps of setting a plurality of power levels for each of said resonance frequencies which occur simultaneously during a bonding operation.

3. The method as set forth in claim 2 wherein the steps of setting a plurality of power levels comprise adjusting the level of voltage being applied to a power amplifier employed for driving said multi-resonance frequency transducer at a plurality of resonance frequencies.

4. The method as set forth in claim 3 wherein the steps of adjusting the level of voltage comprise setting a desired voltage to be applied to said power amplifier, sensing the voltage applied to said transducer, and generating a feedback error control signal for adjusting the output of said power amplifier to the desired voltage.

5. The method as set forth in claim 1 wherein the steps of programming predetermined energy levels comprises converting the energy level to a proportional voltage level, and generating a desired voltage level to be applied to a power amplifier employed for driving said multi-resonance frequency transducer.

6. The method as set forth in claim 1 wherein the step of programming a predetermined energy control profile comprises setting a composite frequency, and determining through mathematical computations the power level for a high and a low frequency.

7. The method as set forth in claim 6 wherein the step of determining the power level for a high and a low frequency further includes determining the power levels at the start and the end of a wire bond.

8. The method as set forth in claim 7 wherein the power levels at the end of a wire bond are set forth to grow a diffusion bond to a predetermined area and strength.

9. The method as set forth in claim 1 which further includes testing a device to be bonded to determine an optimum desired composite frequency for conducting the first phase of a wire bonding operation, then
    conducting a teach operation for programming the automatic wire bonder.

10. The method as set forth in claim 1 wherein the step of programming further includes setting levels of control to maintain one of the variables of voltage or current or power at a constant level for at least one phase of the bonding operation.

11. The method as set forth in claim 10 which further includes sensing the variable to be maintained constant, and
    coupling the sensed level to a controller as a feedback signal level.

12. The method of making multi-frequency wire bonds with a bonding tool in an ultrasonic transducer, comprising the steps of:
    applying a plurality of independent resonance frequency power to said ultrasonic transducer predetermined to respond to each of the resonance frequencies to produce a known displacement (D) of the ultrasonic transducer,
    performing a bonding operation on a fine wire, and
    simultaneously changing the power levels of the frequency signals being applied to said transducer.

13. The method as set forth in claim 12 which further includes changing the power levels according to a power profile.

14. A method of making multi-frequency ultrasonic wire bonds with an automatic wire bonder, comprising the step of:
    coupling a multi-resonance frequency wire bonding transducer to a controllable source of multi-resonance frequency power,
    programming a predetermined first energy level and time duration for a high resonance frequency energy to be used during a first phase of a bonding operation,
    programming a predetermined second energy level and time duration for a low resonance frequency energy to be used during subsequent phases of a bonding operation, starting a fine wire bonding operation by applying a bonding force and said high resonance frequency energy, completing a fine wire bonding operation by applying a bonding force and said low resonance frequency energy, and maintaining a bonding force on a fine wire during said first and said subsequent phase of the bonding operation, adjusting the energy levels of the high and low resonance frequencies so that the high resonance frequency energy level is decreased while the low resonance frequency energy level is increased, and terminating the bonding operation after growing an intermetallic bond between the fine wire and a bonding target.

15. The method as set forth in claim 14 wherein the step of programming a predetermined energy control profile includes minimizing the time required for a plurality of phases of a wire bonding operation.

* * * * *